United States Patent [19]
Liu et al.

[11] Patent Number: 5,365,105
[45] Date of Patent: Nov. 15, 1994

[54] SIDEWALL ANTI-FUSE STRUCTURE AND METHOD FOR MAKING

[75] Inventors: David K. Liu, Dallas; Kueing-Long Chen, Plano; Bert R. Riemenschneider, Murphy, all of Tex.

[73] Assignee: Texas Instruments Incorporated, Dallas, Tex.

[21] Appl. No.: 113,507

[22] Filed: Aug. 27, 1993

Related U.S. Application Data

[63] Continuation of Ser. No. 954,593, Sep. 30, 1992, abandoned, which is a continuation of Ser. No. 657,703, Feb. 19, 1991, abandoned.

[51] Int. Cl.⁵ .................. H01L 27/02; H01L 17/00
[52] U.S. Cl. .................. 257/530; 257/390; 365/96
[58] Field of Search .................. 357/4, 51; 265/96; 257/530, 529, 50

[56] References Cited

U.S. PATENT DOCUMENTS 4,899,205  2/1990  Hamdy et al. .................. 357/51
4,914,055  4/1990  Gordon et al. .................. 437/192

FOREIGN PATENT DOCUMENTS 250078    1/1987  European Pat. Off. .......... 257/530
58-77097  5/1983  Japan ......................... 365/96
59-148198 8/1984  Japan ......................... 365/96
1494040   7/1989  U.S.S.R. ...................... 365/96

Primary Examiner—Sara W. Crane
Assistant Examiner—Donald L. Monin, Jr.
Attorney, Agent, or Firm—Douglas A. Sorensen; Richard L. Donaldson; William E. Hiller

[57] ABSTRACT

A described embodiment of the present invention includes an anti-fuse comprising: a first conductive layer having a horizontal major surface and having a substantially vertical sidewall; a thick insulating layer formed on the horizontal major surface of the first conductive layer; a dielectric layer formed on the vertical sidewall; and a second conductive layer formed on the dielectric layer. In an additional embodiment, the first and/or second conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

24 Claims, 3 Drawing Sheets

SIDEWALL ANTI-FUSE STRUCTURE AND METHOD FOR MAKING

This application is a continuation of Ser. No. 07/954,593 filed Sep. 30, 1992, now abandoned, which is a continuation of Ser. No. 07/657,703 filed Feb. 19, 1991, now abandoned.

FIELD OF THE INVENTION

The present invention relates to the field of integrated circuit technology. More specifically, the present invention relates to the field of programmable integrated circuit devices.

BACKGROUND OF THE INVENTION

In integrated circuit fabrication, it is often desirable to allow a system whereby a user may customize an integrated circuit to their particular needs. Because of the great expense involved in designing specific integrated circuits for many specific tasks, programmable integrated circuits have been developed which allow the user to program the integrated circuit to their specific needs. An emerging type of programmable device is field programmable gate arrays (FPGAs). These devices provide large arrays of fusible type structures which allow the user to program the functional operation of the devices by altering the conductive state of these fusible devices. One such fusible device is called an anti-fuse. An anti-fuse operates in the opposite of the traditional meaning of the term "fuse". An anti-fuse is programmed by providing a voltage above a threshold determined by the characteristics of the device which causes a large current to pass through a dielectric layer between two conductive layers. After this threshold voltage has been reached, a conductive connection between the two conductive layers is permanently established. This is opposite the traditional meaning of a fuse in that when a high current is passed through a traditional fuse, the fuse is burned open and thus a conductive connection is broken. An example of the anti-fuse technology can be found in Mohsen, et. al., "Programmable Low Impedance Anti-fuse Element", U.S. Pat. No. 4,823,181 issued Apr. 18, 1989. This patent is hereby incorporated by reference. A field programmable gate array structure which utilizes anti-fuse elements is described in Gamal et. al., "An Architecture For Electrically Configurable Gate Arrays", IEEE Journal of Solid State Circuits, Vol. 24, No. 2, Pgs. 394–398, (April 1989). This article is hereby incorporated by reference.

As in all integrated circuits, it is desirable to provide a circuit which operates as rapidly as possible. Prior art anti-fuse structures provide horizonal areas which are limited by the lithography capabilities used to fabricate the integrated circuit. These devices are in arrays with a very thin dielectric (60–200 Å as disclosed in the Mohsen, et. al. patent). Because these dielectrics must be very thin, a very high capacitance is provided between the conductive leads forming the gate array. In addition, because there are many of these devices along a particular lead, the resistive/capacitive (RC) time constant for a particular lead is very high. This creates a very large time lag from when a voltage is applied to a certain lead until the lead is charged up to the desired voltage. Thus it is desirable to minimize the capacitive coupling provided by an anti-fuse element. In addition, it is desirable to minimize the lateral area covered by anti-fuse structure to allow for greater packing density of anti-fuse elements. This allows for shorter conductive leads for the same amount of anti-fuse elements as compared to the prior art structures. Because the anti-fuse leads are shorter, the resistance along the length of the lead is minimized and the RC constant is further reduced.

SUMMARY OF THE INVENTION

A described embodiment of the present invention includes an anti-fuse comprising: a first conductive layer having a horizontal major surface and having a substantially vertical sidewall; a thick insulating layer formed on said horizontal major surface of said first conductive layer; a dielectric layer formed on said vertical sidewall; and a second conductive layer formed on said dielectric layer. In an additional embodiment, said first and/or second conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

Another embodiment of the present invention includes an array of anti-fuses arranged in rows and columns, comprising: a first plurality of conductive layers, each having a horizontal major surface and each having a substantially vertical sidewall; a plurality of thick insulating layers formed on said horizontal major surfaces of said first plurality of conductive layers; a plurality of dielectric layers formed on said vertical sidewalls; and a second plurality of conductive layers running perpendicular to said first plurality of conducive layers, said second plurality of conductive layers extending onto said dielectric layer on said sidewalls where said second plurality of conductive layers intersects said first plurality of conductive layers. In another embodiment of the present invention, said first and/or second plurality of conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

Yet another embodiment of the present invention includes an array of anti-fuses arranged in rows and columns, comprising: a first plurality of conductive layers, each having a horizontal major surface; a plurality of conductive extensions extending perpendicularly from each of said first plurality of conductive layers in a plane parallel to said horizontal major surface, each extension having a substantially vertical sidewall; a plurality of thick insulating layers formed on said horizontal major surfaces of said first plurality of conductive layers and said plurality of conductive extensions; a plurality of dielectric layers formed on said vertical sidewalls; and a second plurality of conductive layers running perpendicular to said first plurality of conductive layers, said second plurality of conductive layers extending onto said dielectric layer on said sidewalls, said second plurality of conductive layers overlying said extensions. In another embodiment of the present invention, said first and/or second plurality of conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

An additional embodiment of the present invention includes a method for forming an anti-fuse comprising: forming a first conductive layer having a horizontal major surface and having a substantially vertical sidewall; forming a thick insulating layer formed on said horizontal major surface of said first conductive layer; forming a dielectric layer formed on said vertical sidewall; and forming a second conductive layer formed on said dielectric layer. In an additional embodiment said first and/or second conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

Another embodiment of the present invention includes a method for forming an array of anti-fuses arranged in rows and columns, comprising: forming a first plurality of conductive layers, each having a horizontal major surface and each having a substantially vertical sidewall; forming a plurality of thick insulating layers formed on said horizontal major surfaces of said first plurality of conductive layers; forming a plurality of dielectrics layer formed on said vertical sidewalls; and forming a second plurality of conductive layers running perpendicular to said first plurality of conducive layers, said second plurality of conductive layers extending onto said dielectric layer on said sidewalls where said second plurality of conductive layers intersects said first plurality of conductive layers. In another embodiment of the present invention, said first and/or second conductive layers comprise polycrystalline silicon and a conductive material selected from the group of titanium, tungsten, molybdenum, platinum, titanium silicide, tungsten silicide, molybdenum silicide, platinum silicide, titanium nitride and combinations thereof.

An additional embodiment of the present invention includes a method for forming an array of anti-fuses arranged in rows and columns, comprising: forming a first plurality of conductive layers, each having a horizontal major surface; forming a plurality of conductive extensions extending perpendicularly from each of said first plurality of conductive layers in a plane parallel to said horizontal major surface, each extension having a substantially vertical sidewall; forming a plurality of thick insulating layers formed on said horizontal major surfaces of said first plurality of conductive layers and said plurality of conductive extensions; forming a plurality of dielectric layers formed on said vertical sidewalls; and forming a second plurality of conductive layers running perpendicular to said first plurality of conductive layers, said second plurality of conductive layers extending onto said dielectric layer on said sidewalls, said second plurality of conductive layers overlying said extensions. In an additional embodiment, said first and/or second plurality of conductive layers and said first plurality of extensions comprise polycrystalline silicon and a conductive material selected from the group of titanium, tungsten, molybdenum, platinum, titanium silicide, tungsten silicide, molybdenum silicide, platinum silicide, titanium nitride and combinations thereof. In an additional embodiment, said step of forming said extensions comprises the steps of: forming conductive links between said first plurality of conductive layers; and etching through said conductive links. In an additional embodiment, said step of etching said conductive links is performed by the steps of: forming a masking layer having an opening running parallel to said first plurality of conductive layers positioned between said conductive layers; and etching said conductive links using said masking layer as an etch mask.

DESCRIPTION OF THE DRAWING

FIGS. 4a through 6a and 4b through 6b are plan view diagrams with the associated side view schematic diagrams showing the processing steps, which comprise another embodiment of the present invention, used to fabricate an additional embodiment of the present invention.

DETAILED DESCRIPTION

Figure 1:
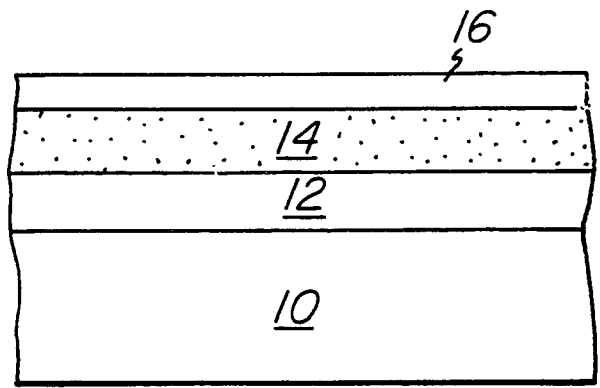
FIGS. 1 through 3 are side view schematic diagrams showing the processing steps, which comprise one embodiment of the present invention, used to fabricate another embodiment of the present invention.
Figure 2:
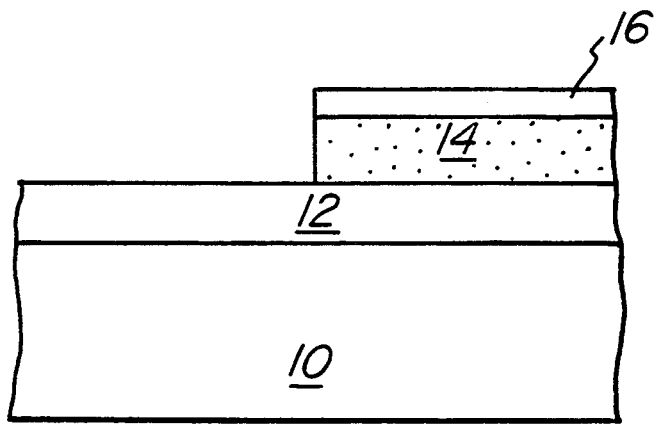
Figure 3:
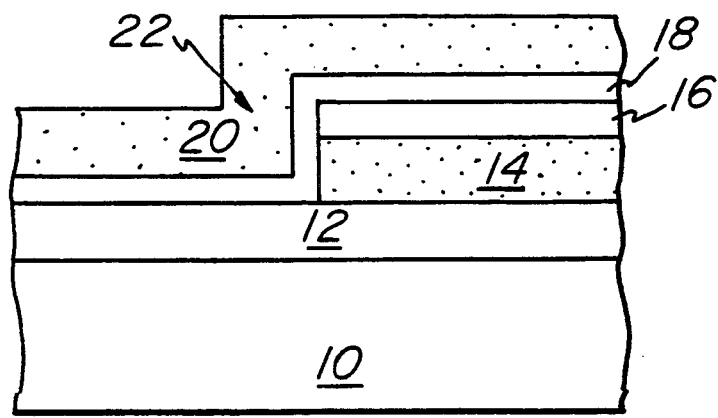

FIGS. 1-3 are a side view schematic diagrams showing the fabrication steps, which comprise one embodiment of the present invention, used to fabricate another embodiment of the present invention. FIGS. 4a-6a are plan view diagrams depicting the processing steps, which comprise another embodiment of the present invention, for fabricating yet another embodiment of the present invention. FIGS. 4b-6b are side view diagrams showing cutaway AA of plan view diagrams 4a-6a.

As shown in FIG. 1, a substrate 10 is initially provided. Substrate 10 may be any of a number of materials but in this preferred embodiment comprises crystalline silicon, thus allowing the fabrication of other devices such as transistors and diodes. Silicon dioxide layer 12 is formed on the surface of substrate 10 using thermal oxidation to a thickness of approximately 5000 Å. Polycrystalline silicon layer 14 is formed on the surface of silicon dioxide layer 12 using chemical vapor deposition. Polycrystalline silicon layer 14 has a thickness of between 2000 and 4000 Å in this preferred embodiment. To provide additional conductivity and thus reduce the resistance of polycrystalline silicon layer 14, additional materials such as titanium, tungsten, molybdenum, platinum, titanium silicide, tungsten silicide, molybdenum silicide, platinum silicide or titanium nitride may be incorporated into polycrystalline silicon layer 14 as additional layers or incorporated into the material itself. In addition, combinations of these materials or other highly conductive materials may be incorporated into polycrystalline silicon layer 14. The use of polycrystalline silicon in layer 14 is exemplary and many other materials will become apparent to those skilled in the art in light of this specification and are considered within the scope of the present invention.

A thick layer of silicon dioxide layer 16 is then formed on the surface of polycrystalline silicon 14. Silicon dioxide layer 16 may be formed by chemical vapor deposition or thermal oxidation of polycrystalline silicon layer 14. If thermal oxidation is used, then an additional thickness of polycrystalline silicon layer 14 must be provided to allow for consumption of this additional area by the thermal oxidation process. In the present embodiment, silicon dioxide layer 16 comprises approximately 2000 Å of silicon dioxide. In additional embodiments, silicon dioxide layer 16 may be other insulators or compound insulators to provide the function of silicon dioxide layer 16. The thickness of silicon dioxide layer 16 is provided to minimize the capacitive coupling between conductive layers to be formed on the surface of silicon dioxide layer 16 and underlying polycrystalline silicon layer 14. Polycrystalline silicon layer 14 and silicon dioxide layer 16 are then patterned and etched to provide the structure shown in FIG. 2. Preferably, this etching is accomplished using an anisotropic etching processing using for example, a plasma of hydrofluoric acid to etch silicon dioxide layer 16 and a plasma of carbon tetrachloride to etch polycrystalline silicon layer 14. This carbon tetrachloride etch is carefully controlled by controlling the flow rates, temperature and plasma energy to provide a high rate of selectivity of polycrystalline silicon over silicon dioxide. The precise settings of the etching process are highly dependent upon the equipment used. This selectivity allows the etch to stop when the etch passes through polycrystalline silicon layer 14 to silicon dioxide layer 12. Although it is preferable to use a highly selective etch, this step is not critical in that silicon dioxide layer 12 is very thick and allows for some etching of silicon dioxide layer 12.

A dielectric layer 18 is then deposited on the surface of the structure of the FIG. 2 as shown in FIG. 3. Dielectric layer 18 is preferably formed using the techniques shown in Liu, et. al. "Scaled Dielectric Anti-fuse Structure for Field Programmable Gate Array Applications", (to be published). A copy of this article is included herewith. As provided in that article, a layer of silicon nitride is deposited on the surface of the structure of FIG. 2. This is accomplished using chemical vapor deposition in an atmosphere such as silane and ammonia. The silicon nitride layer is then subjected to thermal oxidation in a steam ambient to provide an oxynitride layer on the surface of the silicon nitride layer. The combined effective thickness (i.e., relative to silicon dioxide) of dielectric layer 18 is approximately 65 Å. A polycrystalline silicon layer 20 is then deposited on the surface of dielectric layer 18. As with polycrystalline silicon layer 14, the materials and structures of polycrystalline silicon layer 20 may be modified to provide higher conductivity using the materials described with regard to polycrystalline silicon layer 14 or with other materials which will become obvious to those skilled in the art in light of this specification.

The use of the nitride-oxynitride (NO) dielectric provides a two-way characteristic for the breakdown of the anti-fuse provided on the vertical sidewall of polycrystalline silicon layer 14, dielectric layer 18 and polycrystalline silicon layer 20. This anti-fuse structure is indicated by the number 22 in FIG. 3. When a positive potential is provided between polycrystalline silicon layer 20 and polycrystalline silicon layer 14 (i.e., a positive voltage is applied to polycrystalline silicon layer 20 and a reference voltage of 0 volts is applied to polycrystalline silicon layer 14), dielectric layer 18 provides a breakdown voltage of approximately 13½ volts. When the positive potential is applied to polycrystalline silicon layer 14, the breakdown voltage is approximately 10½ volts.

Because anti-fuse 22 is formed on the sidewall of polycrystalline silicon layer 14, the interface area of anti-fuse 22 is the width of the anti-fuse in the thickness of the page times the thickness of polycrystalline silicon layer 14. (The thickness is diminished slightly by the thickness of dielectric layer 18, but dielectric layer 18 is much thinner than polycrystalline silicon layer 14.) Because one dimension of the anti-fuse interface area is defined by the thickness of polycrystalline silicon layer 14 rather than the minimum feature size allowed by the lithography used to fabricate the integrated circuit, the area of anti-fuse 22 is minimized. Because the area of anti-fuse 22 is minimized, the capacitive coupling between polycrystalline silicon layer 20 and polycrystalline silicon layer 14 is also minimized. Another important advantage is the small surface area required for this structure. Because the anti-fuse area is determined by the vertical edge of polycrystalline silicon layer 14, the area necessary for fabricating anti-fuse layer 22 is limited only by the alignment tolerance area required for a single edge. In prior art anti-fuse structures using a horizonal structure, the area which needed to be provided was the area of the anti-fuse itself plus alignment tolerances around the periphery of the anti-fuse. Thus, the anti-fuse of the present embodiment occupies a greatly reduced portion of the surface area of an integrated circuit incorporated the anti-fuse 22 as compared to that of the prior art.

Figure 4A:
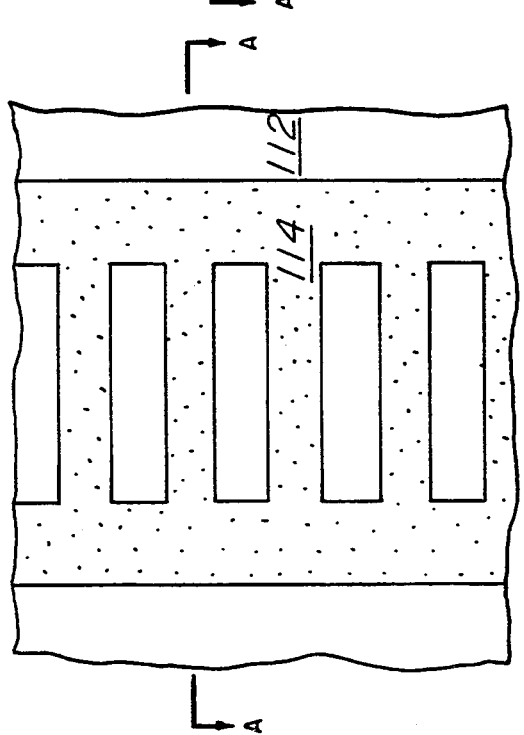
Figure 4B:
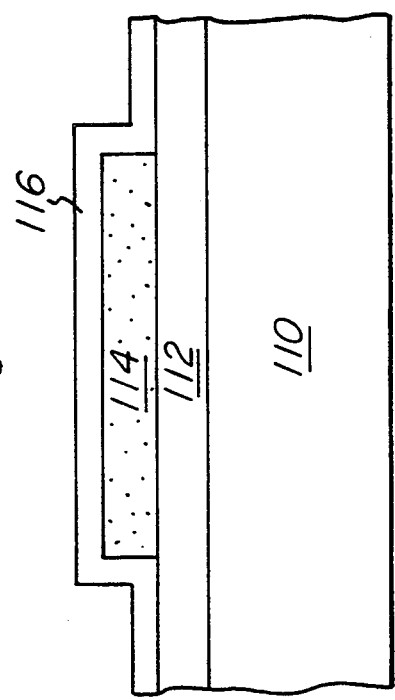

FIGS. 4a–6a and 4b–6b are plan view diagrams with the associated schematic side view diagrams showing the processing steps of another embodiment of the present invention. Substrate 110 and silicon dioxide layer 112 are fabricated using similar processing steps as described with regard to substrate 10 and silicon dioxide layer 12, respectively, as described earlier. Polycrystalline silicon layer 114 is deposited using chemical vapor deposition. Polycrystalline layer 114 is then patterned using masking and anisotropic etching to provide the structure shown in FIG. 4a. As can be seen, polycrystalline silicon layer 114 is patterned in a ladder type structure. This ladder structure allows for the fabrication of a large number of anti-fuse structures using relatively simplified processing steps. Thick silicon dioxide layer 116 is formed by chemical vapor deposition on the surface of silicon dioxide layer 112 and polycrystalline silicon layer 114. Silicon dioxide layer 116 is deposited after polycrystalline silicon layer 114 has been patterned. Silicon dioxide layer 116 is shown in FIG. 4b but is omitted from the plan view of FIG. 4a for clarity.

Figure 5A:
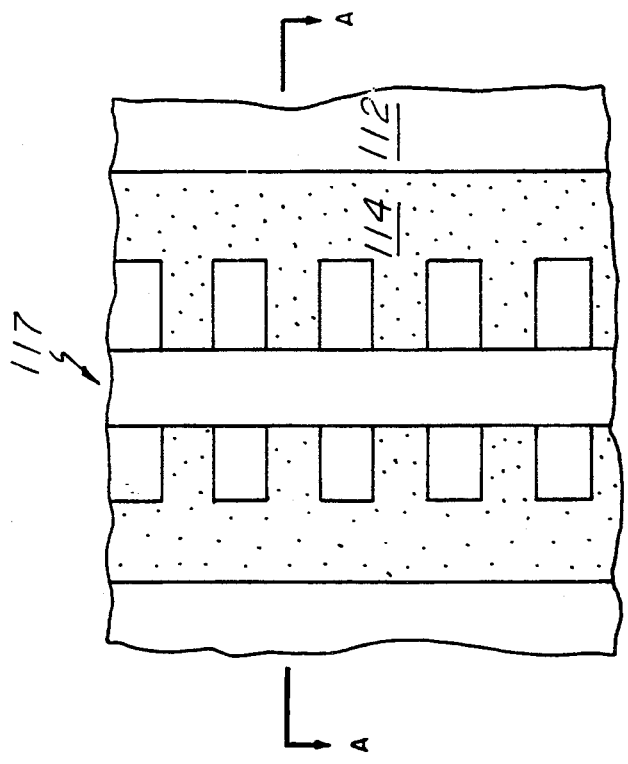
Figure 5B:
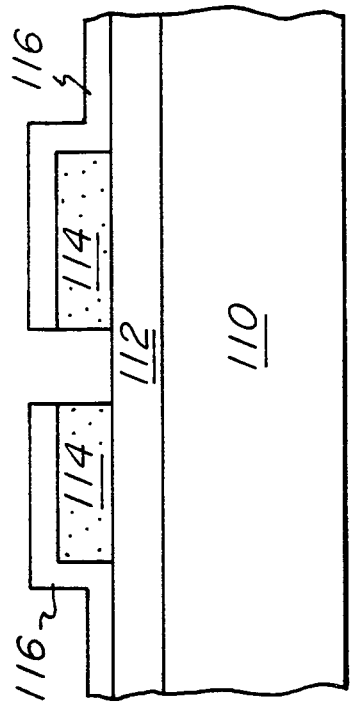
Figure 6A:
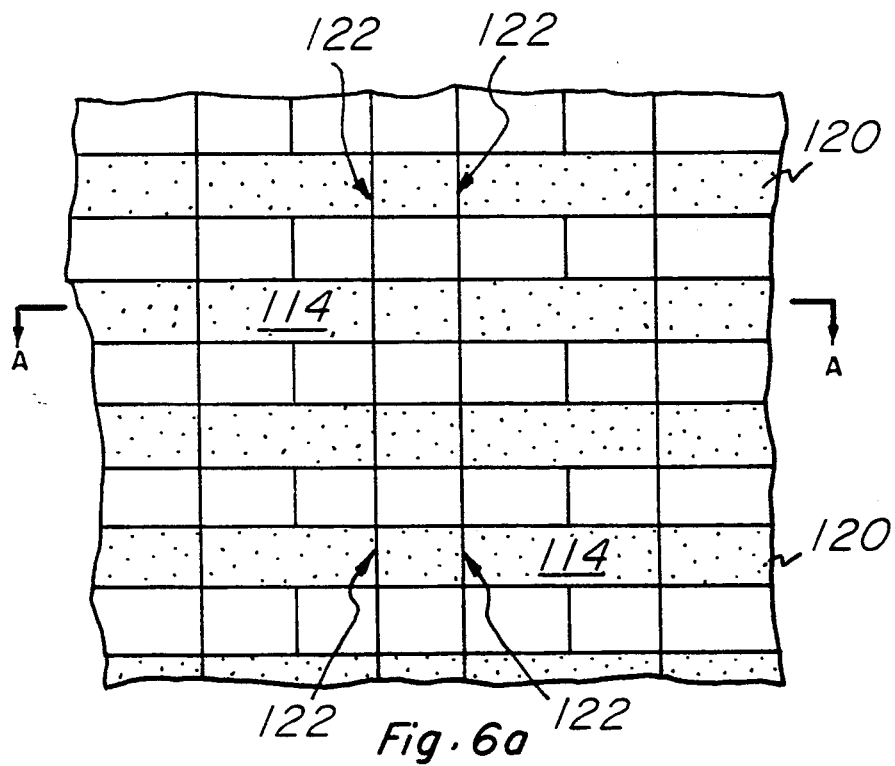
Figure 6B:
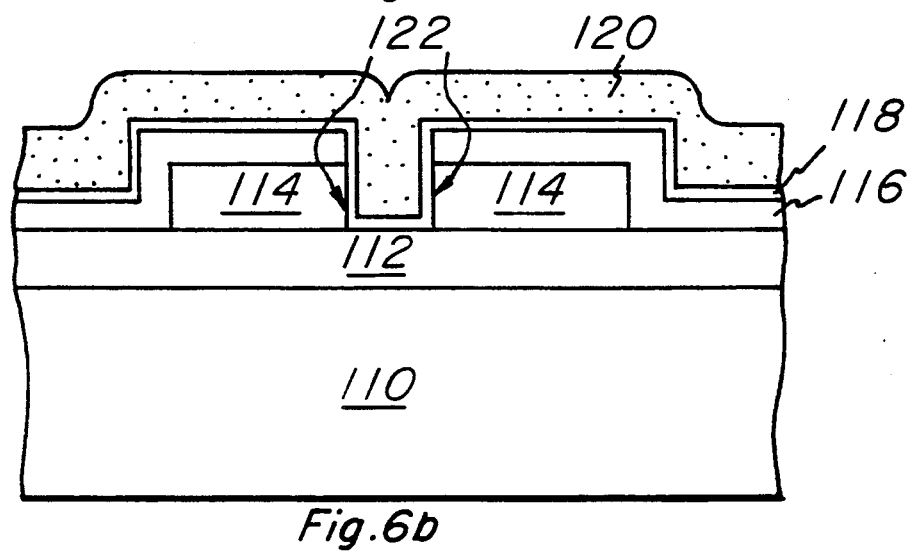

An etch mask (not shown) is then formed having a thin horizontal opening perpendicular to the "rungs" of the ladder structure of polycrystalline silicon layer 114. This etch mask is used to etch opening 117 as shown in FIG. 5a. A plasma of hydrofluoric acid is used to etch silicon dioxide layer 116 and a plasma of carbon tetrachloride is used to etch polycrystalline silicon layer 114 down to silicon dioxide layer 112. As a part of this process the portions of silicon dioxide layer 116 between the rungs of the ladder will be etched away. The width of the rungs of the ladder are selected so as to allow alignment tolerances for opening 117 so that opening 117 will only intersect the rungs of the ladder and will not contact the edges, although some overlap may be tolerated. The resulting structure is shown in side view in FIG. 5b. A dielectric layer 118 is then formed using the techniques described with regard to dielectric layer 18 on the surface of the structure of FIGS. 5a and 5b. A layer of polycrystalline silicon 120 is then deposited and patterned in a series of parallel strips overlapping the rungs of the ladder as shown in FIG. 6a. Although polycrystalline silicon is used for layer 120, a number of conductive materials, particularly refractory metals and refractory metal silicides, may be employed. A schematic side view of this structure along cutaway AA is shown in FIG. 6b. Perfect overlap between the rungs of the ladder of polycrystalline silicon layer 114 and the strips of polycrystalline silicon layer 120 is not necessary. Therefore, no additional alignment tolerance other than the minimum lithography dimension provided as the width of the rungs of the ladder is necessary. Thus, a plurality of anti-fuse elements 122 are fabricated using a highly compact array structure and providing a minimum of capacitive coupling between the conductive leads provided by polycrystalline silicon layer 120 and polycrystalline silicon layer 114.

Although specific embodiments of the present invention are described herein, they are not to be considered to be limiting to the scope of the present invention. The scope of the present invention is limited only by the claims appended hereto wherein:

We claim:

1. An anti-fuse comprising:
   a first conductive layer having a horizontal major surface and having a substantially vertical sidewall;
   a thick insulating layer formed on said horizontal major surface of said first conductive layer;
   a dielectric layer formed on said vertical sidewall, said dielectric layer having a thickness less than said thick insulating layer and having a break down voltage less than a selected programming voltage and said thick insulating layer having a sufficient thickness such that said thick insulating layers will not break down when said selected programming voltage is applied across said thick insulating layers; and
   a second conductive layer formed on said dielectric layer and over said thick insulating layer.

2. An anti-fuse as in claim 1 wherein said first conductive layer comprises polycrystalline silicon.

3. An anti-fuse as in claim 1 wherein said insulating layer comprises silicon dioxide.

4. An anti-fuse as in claim 1 wherein said dielectric layer comprises silicon nitride and silicon dioxide.

5. An anti-fuse as in claim 1 wherein said dielectric layer has an effective thickness of 65 Å or less.

6. An anti-fuse as in claim 1 wherein said first conductive layer is formed on an insulator layer.

7. An anti-fuse as in claim 1 wherein said first conductive layer comprises polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

8. An anti-fuse as in claim 1 wherein said second conductive layer comprises polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

9. An array of anti-fuses arranged in rows and columns, comprising:
   a first plurality of conductive layers formed on a substrate, each having a horizontal major surface and each having a substantially vertical sidewall;
   a plurality of thick insulating layers formed on said horizontal major surfaces of said first plurality of conductive layers;
   a plurality of dielectric layers formed on said vertical sidewalls, said dielectric layers having a thickness less than said thick insulating layer and having a break down voltage less than a selected programming voltage and said thick insulating layers having a sufficient thickness such that said thick insulating layer will not break down when said selected programming voltage is applied across said thick insulating layer; and
   a second plurality of conductive layers running perpendicular to said first plurality of conductive layers, said second plurality of conductive layers being formed on said substrate between said first plurality of conductive layers and over said thick insulating layer and said dielectric layer.

10. An array of anti-fuses as in claim 9 wherein said first plurality of conductive layers comprise polycrystalline silicon.

11. An array of anti-fuses as in claim 9 wherein said plurality of insulating layers comprise silicon dioxide.

12. An array of anti-fuses as in claim 9 wherein said plurality of dielectric layers comprise silicon nitride and silicon dioxide.

13. An array of anti-fuses as in claim 9 wherein said plurality of dielectric layers have an effective thickness of 65 Å or less.

14. An array of anti-fuses as in claim 9 wherein said first plurality of conductive layers are formed on an insulator.

15. An array of anti-fuses as in claim 9 wherein said first plurality of conductive layers comprise polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

16. An array of anti-fuses as in claim 9 wherein said second plurality of conductive layers comprise polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

17. An array of anti-fuses arranged in rows and columns, comprising:
   a first plurality of conductive layers formed on a substrate, each having a horizontal major surface;
   a plurality of conductive extensions extending perpendicularly from each of said first plurality of conductive layers in a plane parallel to said horizontal major surface, each extension having a substantially vertical sidewall;
   a plurality of thick insulating layers formed on said horizontal major surfaces of said first plurality of conductive layers and said plurality of conductive extensions;
   a plurality of dielectric layers formed on said vertical sidewalls; and
   a second plurality of conductive layers running perpendicular to said first plurality of conductive layers, said second plurality of conductive layers being formed on said substrate between said first plurality of conductive layers and over said thick insulating layer and said dielectric layer, said second plurality of conductive layers overlying said extensions.

18. An array of anti-fuses as in claim 17 wherein said first plurality of conductive layers and said plurality of extensions comprise polycrystalline silicon.

19. An array of anti-fuses as in claim 17 wherein said plurality of insulating layers comprise silicon dioxide.

20. An array of anti-fuses as in claim 17 wherein said plurality of dielectric layers comprise silicon nitride and silicon dioxide.

21. An array of anti-fuses as in claim 17 wherein said plurality of dielectric layers have an effective thickness of 65 Å or less.

22. An array of anti-fuses as in claim 17 wherein said first plurality of conductive layers and said plurality of extensions are formed on an insulator.

23. An array of anti-fuses as in claim 17 wherein said first plurality of conductive layers and said first plurality of extensions comprise polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

24. An array of anti-fuses as in claim 17 wherein said second plurality of conductive layers and said first plurality of extensions comprise polycrystalline silicon and a conductive material, said conductive material being selected from the group of titanium, tungsten, molybdenum, platinum, titanium silicide, tungsten silicide, molybdenum silicide, platinum silicide, titanium nitride and combinations thereof.

* * * * *